United States Patent
Guo et al.

(10) Patent No.: US 7,394,247 B1
(45) Date of Patent: Jul. 1, 2008

(54) MAGNETIC FIELD ANGLE SENSOR WITH GMR OR MTJ ELEMENTS

(75) Inventors: Yimin Guo, San Jose, CA (US); Grace Gorman, San Jose, CA (US); Po-Kang Wang, San Jose, CA (US)

(73) Assignee: Magic Technologies, Inc., Milpitas, CA (US)

( * ) Notice: Subject to any disclaimer, the term of this patent is extended or adjusted under 35 U.S.C. 154(b) by 0 days.

(21) Appl. No.: 11/881,349

(22) Filed: Jul. 26, 2007

(51) Int. Cl.
*G01R 33/09* (2006.01)
*G01B 7/30* (2006.01)

(52) U.S. Cl. ............. 324/252; 324/207.21; 324/207.25; 324/249; 360/324; 365/158; 365/171

(58) Field of Classification Search ......... 257/421–422, 257/424–425, 427, 467; 360/313–316, 324, 360/324.1, 324.11, 324.2, 325–327; 365/158, 365/171, 173; 324/207.21, 207.25, 249, 324/252

See application file for complete search history.

(56) References Cited

U.S. PATENT DOCUMENTS

| 6,640,652 | B2 | 11/2003 | Kikuchi et al. |
| 6,927,566 | B2 | 8/2005 | Apel et al. |
| 7,005,958 | B2 * | 2/2006 | Wan .................. 338/32 R |
| 7,095,596 | B2 | 8/2006 | Schmollngruber et al. |

OTHER PUBLICATIONS

"Exchange Anisotropy and Micromagnetic Properties of PtMn/NiFe Bilayers", by Taras Pokhil et al., Jrnl. of Appl. Physics, vol. 89, No. 11, Jun. 1, 2001, pp. 6588-6590.
Honeywell Application Note "Applications of Magnetic Position Sensors", AN211, pp. 1-8.

* cited by examiner

*Primary Examiner*—Bot LeDynh
(74) *Attorney, Agent, or Firm*—Saile Ackerman LLC; Stephen B. Ackerman

(57) ABSTRACT

The invention discloses a sensor for 360-degree magnetic field angle measurement. It comprises multiple GMR (or MTJ) stripes with identical geometries except for their orientations. These are used as the building blocks for a pair of Wheatstone bridges that signal the direction of magnetization of their environment. The design greatly enhances sensitivity within GMR stripes and does not require an additional Hall sensor in order to cover the full 360 degree measurement range.

37 Claims, 4 Drawing Sheets

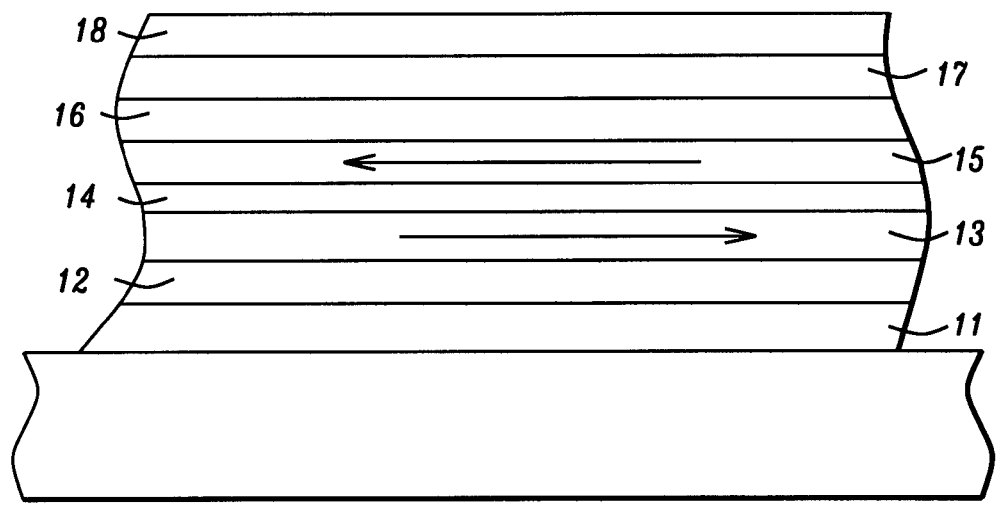
FIG. 1 – Prior Art
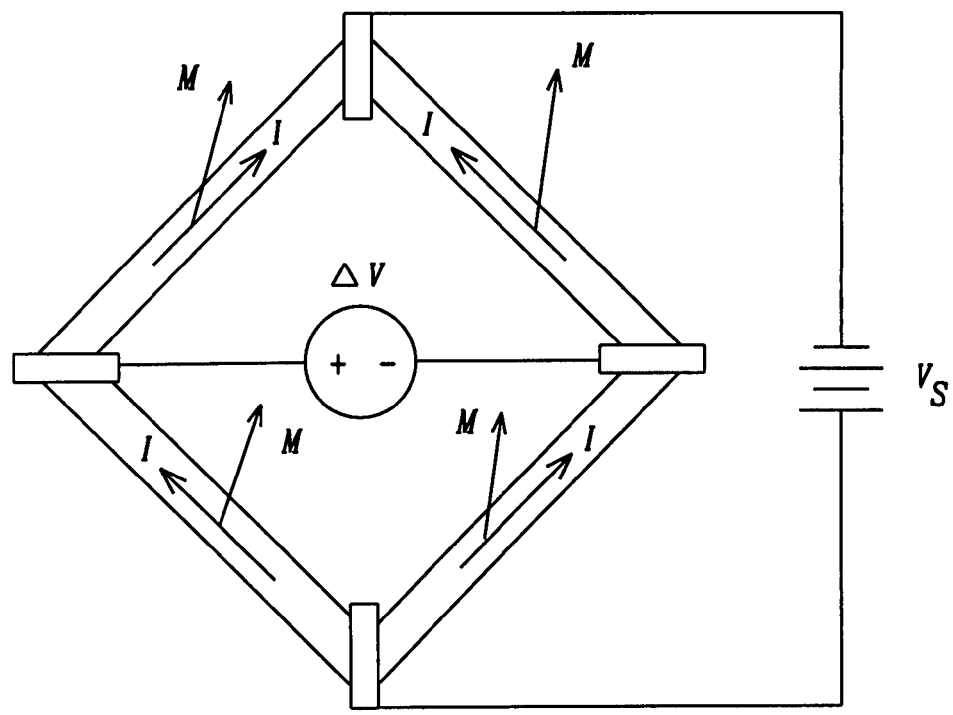
FIG. 2 – Prior Art

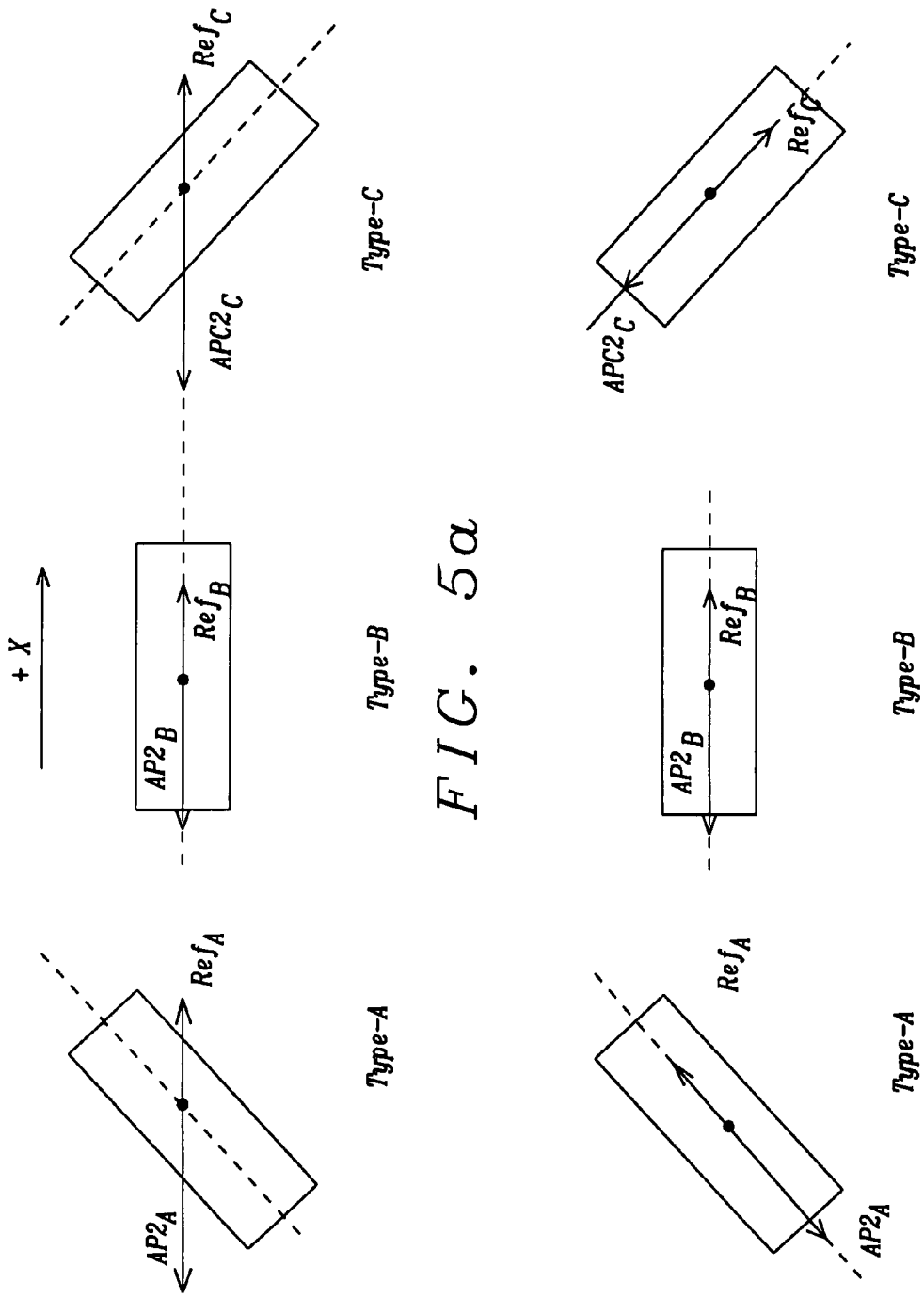

MAGNETIC FIELD ANGLE SENSOR WITH GMR OR MTJ ELEMENTS

FIELD OF THE INVENTION

The invention relates to the general field of measurement of the direction of a magnetic field with particular reference to coverage of a full 360 degree range at minimum cost.

BACKGROUND OF THE INVENTION

The present invention discloses a single chip solution for a GMR (giant magneto-resistance) or MTJ (magnetic tunneling junction)-based sensor with a full 360-degree range capability for magnetic field measurement. This design greatly enhances sensitivity relative to prior art devices. It does not require an additional Hall sensor in order to provide a full 360 degree range of measurement. It may be implemented using either a GMR (giant magneto-resistance) or an MTJ (magnetic tunnel junction) device, which terms we will use interchangeably in the description that follows.

As illustrated in FIG. 1, a GMR structure is deposited as a multi-layer structure starting with a seed-layer(11)/AFM (12)/AP2(13)/Ru(14)/AP1(15)/Cu(16)/free layer(17)/capping layer(18), where a ferromagnetic sub-layer AP2, non-magnetic spacer Ru and a ferromagnetic reference sub-layer AP1 form an anti-parallel synthetic pinned layer. In an MTJ structure, the Cu layer just below the free layer is replaced by an insulating tunnel barrier layer, (typically $AlO_x$). The synthetic layer is further pinned by anti-ferromagnetic layer (AFM). The pinning field, or exchange anisotropy, is related to the exchange coupling between an antiferromagnetic (AFM) layer and a ferromagnetic sub-layer (AP2) [2].

In a conventional angle sensor, the sensing elements are four long AMR (anisotropic magneto-resistance) [1] stripes oriented in a diamond shape with the ends connected together by metallization to form a Wheatstone bridge, as shown in FIG. 2. The top and bottom connections of the four identical elements are given a direct current stimulus in the form of a supply voltage (Vs), with the remaining side connections to be measured as $\Delta V$. With no magnetic field present, the side contacts should be at the same voltage. To have the elements' magnetization directions align with an externally applied magnetic field, the latter must be large enough to saturate the permalloy material.

With the AMR elements connected in this fashion to form the Wheatstone bridge, the side contacts will produce a different voltage ($\Delta V$) as a function of the supply voltage, MR ratio, and the angle; which is the angle between the element current flow and element magnetization (M). One set of this bridge only provides a measurement of angles ranging from −45 degree to +45 degree. Combined with a second bridge which is oriented 45-degree in rotation from the first set, a wide range of angles, from −90 degree and +90 degrees, can be measured.

In this prior art design, due to the characteristic of the AMR effect, one of the AMR Wheatstone bridges only detects within a 90-degree angle range while two AMR Wheatstone bridges with 45-degrees orientation difference only allow measurement over a 180-degree angle range. In order to measure a full 360-degree angle, an additional Hall sensor must be used in combination with the two Wheatstone bridges.

REFERENCES

1. Honeywell application note "Applications of Magnetic Position Sensors"
2. Taras Pokhil, et., "Exchange Anisotropy and Micromagnetic Properties of PtMn/NiFe bilayers," J. Appl. Phys. 89, 6588 (2001)

A routine search of the prior art was performed with the following additional references of interest being found:

U.S. Pat. No. 7,095,596 (Schmollngruber et al.) discloses a 360 degree angle sensor comprised of two Wheatstone bridge circuits. U.S. Pat. No. 6,927,566 (Apel et al.) shows four GMR cells arranged at angle of 90 degrees to one another to measure 0 to 360 degrees.

In U.S. Pat. No. 6,640,652, Kikuchi et al. show a device for detecting a change in direction of a magnetic field, rather than the absolute direction of a static field. It uses two Wheatstone bridge arrangements. Each bridge has a pair of GMR elements connected in parallel on each of two sides. The GMR elements on each side are connected in series. The pairs of GMR elements are all parallel, antiparallel, or orthogonal relative to one another.

None of the prior art discussed above provides a method to simultaneously set pinned magnetizations in reference layers of four (or two) GMR elements along various directions during wafer level processes. Consequently the GMR elements have to be cut out of the same wafer and rearranged at 90 degrees to one another to be able to measure 0 to 360 degrees. This adds higher cost for manufacturing and greater error during angle detection.

SUMMARY OF THE INVENTION

It has been an object of at least one embodiment of the present invention to provide a method for measuring the direction of a magnetic field over the full 360-degree range.

Another object of at least one embodiment of the present invention has been to provide a single chip solution that implements said method.

Still another object of at least one embodiment of the present invention has been to provide a process to simultaneously set directions of pinned magnetization in reference layers of non-parallel MR devices such as GMR or MTJ devices.

A further object of at least one embodiment of the present invention has been for said method, when used with said device, to measure said angle to an accuracy of about 0.5 degree.

These objects have been achieved by fabricating a pair of Wheatstone bridges, driven by a common voltage supply, that is built out of three basic building blocks. The latter are all GMR and/or MTJ resistive elements that have a large shape anisotropy. These three basic blocks are oriented, relative to one another as follows: −45-degree (type-A), 0-degree (type-B) and +45-degree (type-C).

In the presence of the field whose direction is to be measured, each device will have a different electrical resistance so different voltages will appear at the four nodes of the two Wheatstone bridges. The resistive elements in the two bridges are arranged so that the voltage difference between the nodes of the first bridge is proportional to the sine of the angle being measured while the voltage difference between the nodes of the second bridge is proportional to the cosine of the angle being measured. These two voltages are inputted to a microcontroller where their quotient is computed, thereby eliminating the proportionality constant accompanying each signal. The result is the tangent of the angle under measurement making the value of the angle itself is readily computable

BRIEF DESCRIPTION OF THE DRAWINGS

FIG. 1 is a schematic cross-section of a typical GMR device.

FIG. 2 illustrates a structure of prior art in which an electric current flows across a Wheatstone bridge constructed of four identical AMR stripes.

FIG. 5(a) shows arrows representing the magnetization directions of both the AP2 and AP1 (reference) layers with an external magnetic field applied along −x direction.

FIG. 5(b) shows arrows representing the magnetization directions of both the AP2 and AP1 (reference) layers which align along the direction of the shape anisotropy for each of the three types of MR resistive element after removing the external magnetic field.

DESCRIPTION OF THE PREFERRED EMBODIMENTS

One class of anti-ferromagnetic materials includes the ordered tetragonal (fct) alloys such as PtMn, PtPdMn, NiMn, etc. The as-deposited state of these materials is a non-magnetic fcc structure and the ferromagnetic sub-layer has no exchange bias (pinning) with similar coercivity to that of a pure ferromagnetic layer. For all types of GMR stripes, in order to set pinning directions of synthetic anti-parallel layers along their own longitudinal axes, the magnetic moment of sub-layer AP2 is designed to be higher than that of the reference sub-layer AP1, resulting in a non-zero net magnetic moment of the synthetic anti-parallel pinned layer.

Once deposited, the GMR film is patterned into rectangular stripes that have a very large aspect ratio, whereby each stripe has a large shape anisotropy generated by the net magnetic moment along its longitudinal axis. Before thermal annealing is initiated, a large magnetic field is applied along the −x direction yjat is sufficient to almost saturate (magnetically) both sub-layer AP1 and sub-layer AP2. This large magnetic field and is then gradually reduced to zero followed by high temperature thermal annealing in the absence of any external magnetic field.

Figure 3A:
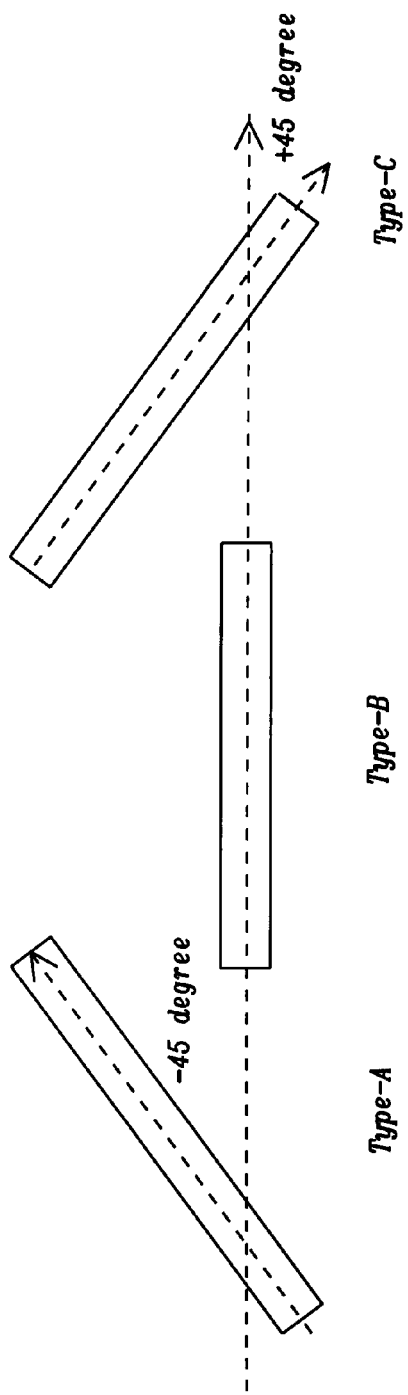
FIG. 3(a) shows the three basic building blocks that are used to form the angle measuring device of the present invention
Figure 3B:
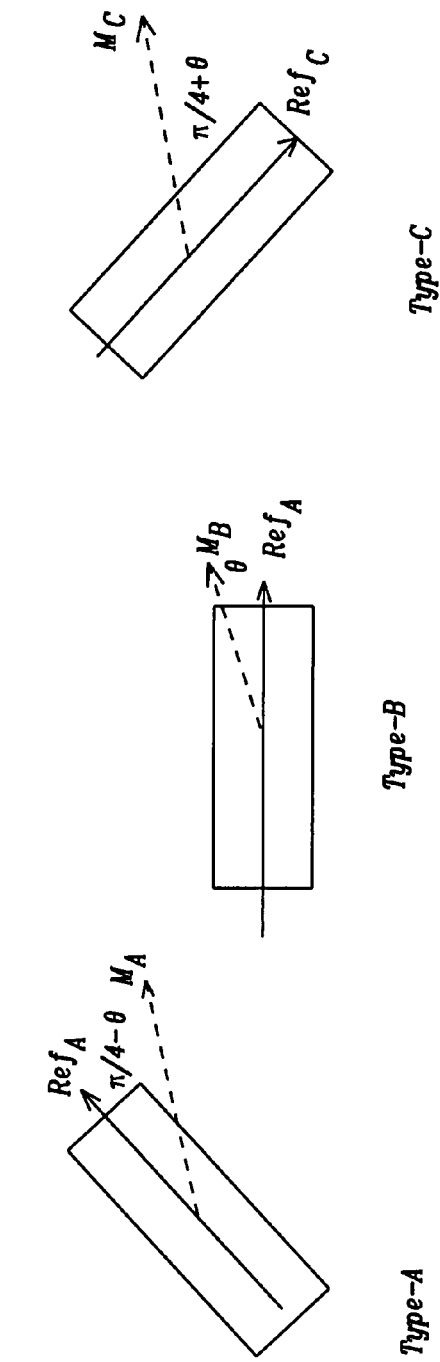
FIG. 3(b) illustrates the direction of magnetization M of each of the free layers in the three MR resistive elements as well as the magnetizations R of their respective reference layers.

A pair of Wheatstone bridges is now constructed using different orientations of these GMR stripes as the building blocks. All stripes are made with exactly the same geometry and process. We will refer to these stripe orientations as follows:

−45-degree (type-A), 0-degree (type-B) and +45-degree (type-C), as shown in FIG. 3a. In FIG. 3b, $M_A$, $M_B$ and $M_C$ represent magnetizations of free layers in the three types of GMR stripes, respectively, while $Ref_A$, $Ref_B$ and $Ref_C$ represent the magnetization of the reference (i.e. pinned) layers in the three types of GMR stripe.

The two Wheatstone bridges are energized by a common voltage supply (typically between about 0.5 and 5.0 volts).

During magnetic field angle sensing, the magnetic field is large enough to saturate and align all GMR free layer magnetizations in the same field direction. Respectively, resistances for these three types of GMR stripes are:

$$R_A = R + dR \cdot \frac{1 - \cos\left(\frac{\pi}{4 - \theta}\right)}{2}$$

$$R_B = R + dR \cdot \frac{1 - \cos(\theta)}{2}$$

$$R_C = R + dR \cdot \frac{1 - \cos\left(\frac{\pi}{4 + \theta}\right)}{2}$$

where R represents the resistance when the free layer magnetization and pinned reference layer magnetization are parallel, dR represents the resistance change when the free layer magnetization rotates to be anti-parallel to the pinned reference layer magnetization.

We further obtained:

$$R_C - R_A = dR \cdot \frac{\cos(\pi/4 - \theta) - \cos(\pi/4 + \theta)}{2} = dR \frac{\sqrt{2}}{2} \cdot \sin(\theta)$$

$(R_A + R_C)/2 - R_B =$ $$dR \cdot \frac{\cos(\theta) - \{\cos(\pi/4 - \theta) + \cos(\pi/4 + \theta)\}/2}{2} = dR \frac{1 - \sqrt{2}/2}{2} \cdot \cos(\theta)$$

Figure 4:
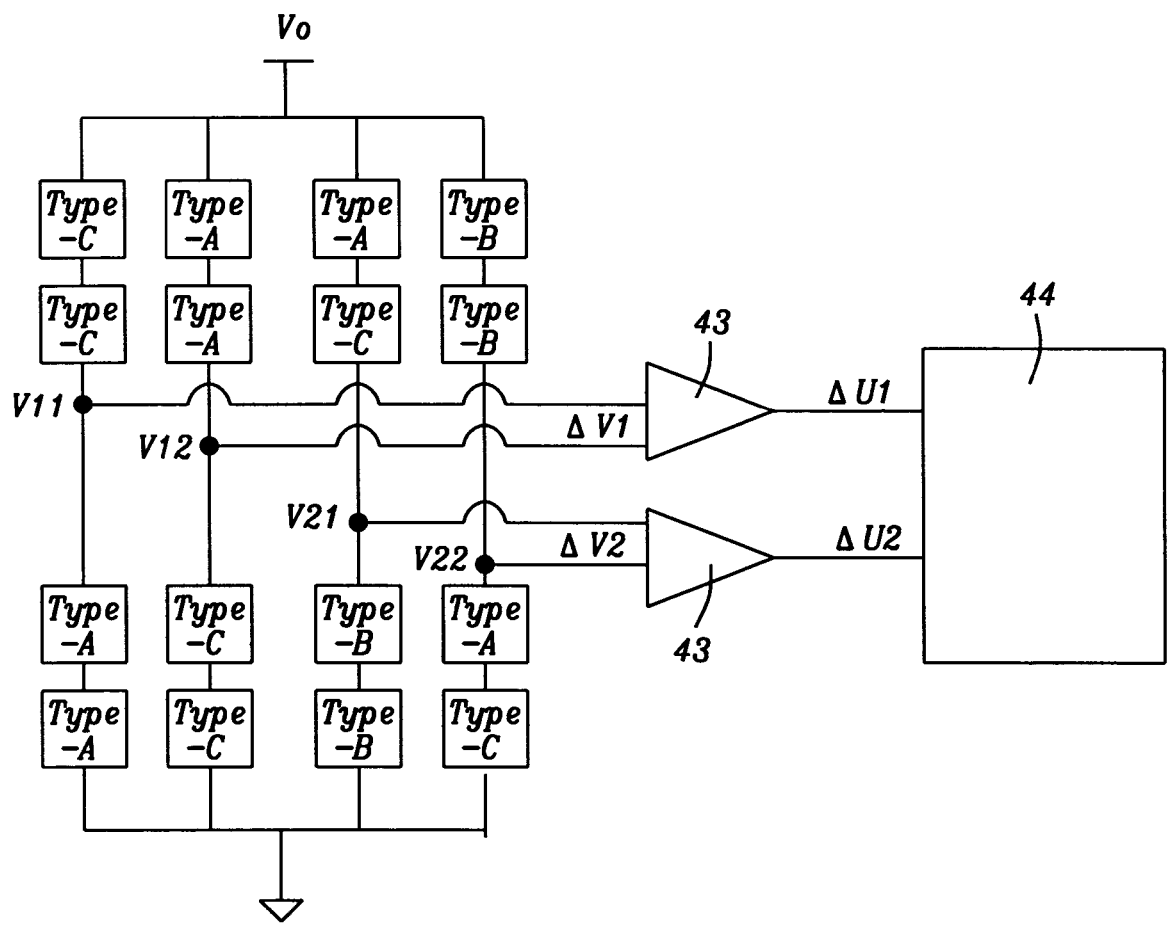
FIG. 4 is a schematic illustration of the device of the present invention.

For the Wheatstone bridge configurations shown in FIG. 4, it can be shown that the voltage difference $\Delta V_1$ is proportional to sin θ while the voltage difference $\Delta V_2$ is proportional to cos θ.

Thus, $\Delta U_1 = A_1 \sin \theta$, $\Delta U_2 = A_2 \cos \theta$. where $A_1$ and $A_2$ are the respective output amplitudes of the two amplifiers. If we make $A_1 = A_2$, then angle θ can be determined from θ=arctan ($\Delta U_1/\Delta U_2$), since the amplifications now cancel out. Computation of the value of arctan ($\Delta U_1/\Delta U_2$) can be accomplished in microcontroller 44, seen in FIG. 4, either by direct computation or from a lookup table. Also, the equalization of $A_1$ and $A_2$ can be achieved by simultaneously feeding the same signal to amplifiers 43 in FIG. 4, connecting their outputs to a differential amplifier, and then adjusting amplification of either or both until the differential amplifier reads zero. Alternatively, the differential amplifier may be omitted and the ratio of the amplifier strengths can be stored in the microcontroller as a normalizing constant for use during the computation of θ.

The device illustrated in FIG. 4 is capable of measuring angle θ to an accuracy of ±0.5 degrees.

In addition to computing a value for θ, it is also necessary to determine in which quadrant θ lies. This is accomplished in the microcontroller 44 by a comparison of the signs of $\Delta U_1$ and $\Delta U_2$ (see FIG. 4). These are summarized in TABLE I as follows:

TABLE I

Relative voltages at the output nodes as a function of the quadrant in which the measured angle belongs

| Quadrant | $\Delta U_1$ | $\Delta U_2$ |
| --- | --- | --- |
| 0-90° | + | + |
| 90-180° | + | − |
| 180-270° | − | − |
| 270-360° | − | + |

Formation of the GMR/MTJ Stripes:

For all types of GMR stripes, it is required to set pinning directions of synthetic anti-parallel layers along their own longitudinal axes. For this purpose, the magnetic moment of sub-layer AP2 is designed to be higher than that of the reference sub-layer AP1, giving a non-zero net magnetic moment of the synthetic anti-parallel pinned layer. This is accomplished by making AP1 thinner than AP2. Typically, AP1 would be between about 10 and 30 Angstroms thick while AP2 would be between about 20 and 50 Angstroms thick.

After deposition, the GMR film is patterned into rectangular stripes with very large aspect ratio) generally 3:1 or greater, so that in each stripe a large shape anisotropy is generated by the net magnetic moment along its longitudinal axis.

Before performing thermal annealing, a large magnetic field (typically between about 100 and 10,000 Oe) is applied along the −x direction, at or near saturation of both sub-layer AP1 and sub-layer AP2, and is then gradually reduced. As a result, the thinner AP1 magnetization is first to rotate toward the +x direction due to the anti-parallel coupling with the thicker sub-layer AP2, making the net moment of the synthetic AFM structure point towards the external field (−x direction), as shown in FIG. 5(a).

Finally as the magnetic field is reduced to zero, the AP1 magnetization (with the AP2 magnetization being in the opposite direction) settles down along its stripe's longitudinal direction due to its longitudinal shape anisotropy, as shown in FIG. 5(b). Then a high temperature thermal anneal (at between about 250 and 350° C. for up to about 1000 minutes) is conducted without the application of an external magnetic field. As a result, the magnetizations of the reference layers are permanently pinned by their AFM layers to lie along each GMR's long axis direction. Therefore, the pinned directions for type-A, type-B and type-C stripes are set to be −45-degree, 0-degree and +45-degree, respectively, relative to the +x direction.

What is claimed is:

1. A method of measuring an angle, from 0 to 360 degrees, that corresponds to a direction of a magnetic field, comprising:
providing a type A magneto-resistive element having a reference layer that is magnetically pinned in a direction that is at a positive angle relative to an X direction;
providing a type B magneto-resistive element having a reference layer that is magnetically pinned in a direction that is parallel to said X direction;
providing a type C magneto-resistive element having a reference layer that is magnetically pinned in a direction that is at a negative angle relative to said X direction, said positive and negative angles having the same absolute value;
providing first and second Wheatstone bridges energized by a common voltage source, each of said Wheatstone bridges comprising electrically parallel first and second sections;
each of said sections further comprising serially connected first and second pairs of said magneto-resistive elements, there being a voltage output terminal between each of said first and second pairs;
the first resistive element pair of the first section of the first Wheatstone bridge further comprising two serially connected type C elements;
the second resistive element pair of the first section of the first Wheatstone bridge further comprising two serially connected type A elements;
the first resistive element pair of the second section of the first Wheatstone bridge further comprising two serially connected type A elements;
the second resistive element pair of the second section of the first Wheatstone bridge further comprising two serially connected type C elements;
the first resistive element pair of the first section of the second Wheatstone bridge further comprising a type A element in series with a type C element;
the second resistive element pair of the first section of the second Wheatstone bridge further comprising two serially connected type B elements;
the first resistive element pair of the second section of the second Wheatstone bridge further comprising two serially connected type B elements;
the second resistive element pair of the second section of the second Wheatstone bridge further comprising a type A element in series with a type C element;
connecting said voltage output terminals from said first Wheatstone bridge to a first amplifier and connecting said voltage output terminals from said second Wheatstone bridge to a second amplifier whereby said first amplifier outputs a voltage whose magnitude is proportional to the sine of said angle and said second amplifier outputs a voltage whose magnitude is proportional to the cosine of said angle;
connecting said first and second amplifier outputs to a microcontroller wherein a value for said angle is then computed from the equation arctan $\theta$=sine $\theta$/cos $\theta$; and
determining in which quadrant said angle belongs through comparison of the signs of said first and second amplifier outputs.

2. The method of claim 1 wherein said type A, type B and type C resistive elements are fabricated on the same wafer to have the same geometry, resistance and magneto-resistance.

3. The method of claim 1 wherein a minimum magnetic field of about 50 Oe is required for reliable measurement of said angle.

4. The method of claim 1 wherein each resistive element is selected from the group consisting of GMR and MTJ devices.

5. The method of claim 1 wherein said common voltage source provides a voltage between about 0.5 and 5.0 volts.

6. The method of claim 1 further comprising connecting said first and second amplifiers to a common voltage source, connecting a differential amplifier between said first and second amplifier outputs, and then adjusting said first and second amplifiers until said differential amplifier produces an output of zero volts.

7. The method of claim 1 further comprising connecting said first and second amplifiers to a common voltage source, and then storing the quotient of said first and second amplifier outputs as a constant in said microcontroller for use when said microcontroller computes a value for $\theta$.

8. The method of claim 1 wherein the step of computing a value for $\theta$ from the equation arctan $\theta$=sin $\theta$/cos $\theta$, is accomplished through use of a lookup table previously stored in said microcontroller.

9. The method of claim 1 wherein the step of computing a value for $\theta$ from the equation arctan $\theta$=sin $\theta$/cos $\theta$, is accomplished by in situ computation of said arctan function for each particular value of $\sin(\theta)/\cos(\theta)$.

10. A process to simultaneously set directions of pinned magnetization in reference layers of non-parallel MR devices that comprise synthetic AFM structures, including a magnetic reference layer (AP1), a non-magnetic spacing layer, a magnetic pinned layer (AP2), and an anti-ferromagnetic (AFM) layer, comprising:

ensuring that each AP1 layer is thinner than its corresponding AP2 layer;

placing said MR devices in a magnetic field having a direction and a magnitude that are sufficient to incline AP2 layer magnetizations toward said magnetic field direction;

then reducing said magnetic field to zero whereby magnetizations of all AP2 layers rotate into their longitudinal shape anisotropy directions and all AP1 layer magnetizations rotate into directions opposite to that of their corresponding AP2 layer due to anti-parallel coupling with the thicker AP2 layers, thereby forming synthetic AFM structures each having a non-zero net magnetic moment along its longitudinal direction due to longitudinal shape anisotropy; and when said magnetic field has been reduced to zero, subjecting said MR devices to a thermal anneal, thereby pinning each AP1 layer, each along its long dimension.

11. The process recited in claim 10 wherein each MR device has an AFM layer selected from the group consisting of PtMn, NiMn, PtPdMn, and CrPtMn.

12. The process recited in claim 10 wherein each AP1 layer is between about 10 and 30 Angstroms thick.

13. The process recited in claim 10 wherein each AP2 layer is between about 20 and 50 Angstroms thick.

14. The process recited in claim 10 wherein said non-zero net magnetic moment is not less than that of a 2 nm thick NiFe layer.

15. A device for measuring a direction of magnetization, comprising:

a type A magneto-resistive element having a reference layer that is magnetically pinned in a direction that is at a positive angle relative to an X direction;

a type B magneto-resistive element having a reference layer that is magnetically pinned in a direction that is parallel to said X direction;

a type C magneto-resistive element having a reference layer that is magnetically pinned in a direction that is at a negative angle relative to said X direction;

said positive and negative angles having the same value of about 45 degrees;

first and second Wheatstone bridges energized by a common voltage source, each of said Wheatstone bridges comprising electrically parallel first and second sections;

each of said sections further comprising serially connected first and second pairs of said magneto-resistive elements, there being a voltage output terminal between each of said first and second pairs;

the first resistive element pair of the first section of the first Wheatstone bridge further comprising two serially connected type C elements;

the second resistive element pair of the first section of the first Wheatstone bridge further comprising two serially connected type A elements;

the first resistive element pair of the second section of the first Wheatstone bridge further comprising two serially connected type A elements;

the second resistive element pair of the second section of the first Wheatstone bridge further comprising two serially connected type C elements;

the first resistive element pair of the first section of the second Wheatstone bridge further comprising a type A element in series with a type C element;

the second resistive element pair of the first section of the second Wheatstone bridge further comprising two serially connected type B elements;

the first resistive element pair of the second section of the second Wheatstone bridge further comprising two serially connected type B elements;

the second resistive element pair of the second section of the second Wheatstone bridge further comprising a type A element in series with a type C element; said voltage output terminals from said first Wheatstone bridge being connected to a first amplifier and said voltage output terminals from said second Wheatstone bridge being connected to a second amplifier; and outputs from said first and second amplifiers being connected to a micro-controller capable of computing said direction of magnetization from said amplifier output values.

16. The device described in claim 15 wherein each said type A, type B, and type C resistive elements is selected from the group consisting of GMR and MTJ devices.

17. The device described in claim 15 wherein said type A, type B and type C magneto-resistive elements are all fabricated together on a single wafer whereby they have identical geometry, resistance and magneto-resistance.

18. The device described in claim 15 wherein said common voltage source provides a voltage between about 0.5 and 5.0 volts.

19. The device described in claim 15 wherein each of said magneto-resistive elements has an AFM layer selected from the group consisting of PtMn, NiMn, PtPdMn, and CrPtMn.

20. The device described in claim 15 wherein each magneto-resistive element has an AP1 layer that is between about 10 and 30 Angstroms thick.

21. The device described in claim 15 wherein each magneto-resistive element has an AP2 layer that is between about 20 and 50 Angstroms thick.

22. A method of measuring an angle, from 0 to 360 degrees, that corresponds to a direction of a magnetic field, comprising:

providing a type A magneto-resistive element having a reference layer that is magnetically pinned in a direction that is at a positive angle relative to an X direction;

providing a type B magneto-resistive element having a reference layer that is magnetically pinned in a direction that is parallel to said X direction;

providing a type C magneto-resistive element having a reference layer that is magnetically pinned in a direction that is at a negative angle relative to said X direction;

said positive angle and said negative angle having identical values of about 45 degrees;

said three types of magneto-resistive element arranged as four parallel strings of said magneto-resistive elements;

the first resistive element string further comprising two serially connected type C elements, there being a ground connection at a first end and a voltage output terminal at a second end;

the second resistive element string further comprising two serially connected type A elements, there being a ground connection at a first end and a voltage output terminal at a second;

the third resistive element branch further comprising a type A element in series with a type C element, there being a ground connection at a first end and a voltage output terminal at a second end;

the fourth resistive element branch further comprising two serially connected type B elements, there being a ground connection at a first end and a voltage output terminal at a second end;

providing a first constant current source for driving said first resistive element string;

providing a second constant current source for driving said second resistive element string;

providing a third constant current source for driving said third resistive element string;

providing a fourth constant current source for driving said fourth resistive element string;

currents from said the first and second constant current sources being given identical values;

currents from said the third and fourth constant current sources being given identical values;

connecting said voltage output terminals from said first and second resistive element strings to a first amplifier and connecting said voltage output terminals from said third and fourth resistive element strings to a second amplifier whereby said first amplifier outputs a voltage whose magnitude is proportional to the sine of said angle that is being measured and said second amplifier outputs a voltage whose magnitude is proportional to the cosine of said angle;

connecting said first and second amplifier outputs to a microcontroller wherein a value for said angle is then computed from the equation $\arctan \theta = \sin \theta / \cos \theta$; and determining in which quadrant said angle belongs through comparison of the signs of said first and second amplifier outputs.

23. The method of claim 22 wherein said type A, type B and type C magneto-resistive elements are fabricated together on a single wafer whereby they have the same geometry, resistance and magneto-resistance.

24. The method of claim 22 wherein a minimum magnetic field of about 50 Oe is required for reliable measurement of said angle.

25. The method of claim 22 wherein each resistive element is selected from the group consisting of GMR and MTJ devices.

26. The method of claim 22 wherein said common voltage source provides a voltage between about 0.5 and 5 volts.

27. The method of claim 22 further comprising connecting said first and second amplifiers to a common voltage source, connecting a differential amplifier between said first and second amplifier outputs, and then adjusting said first and second amplifiers until said differential amplifier produces an output of zero volts.

28. The method of claim 22 further comprising connecting said first and second amplifiers to a common voltage source, and then storing a quotient of said first and second amplifier outputs as a constant in said microcontroller for use when said microcontroller computes a value for $\theta$.

29. The method of claim 22 wherein the step of computing a value for $\theta$ from the equation $\arctan \theta = \sin \theta / \cos \theta$, is accomplished through use of a lookup table previously stored in said microcontroller.

30. The method of claim 22 wherein the step of computing a value for $\theta$ from the equation $\arctan \theta = \sin \theta / \cos \theta$, is accomplished by in situ computation of said arctan function for each particular value of $\sin \theta / \cos \theta$.

31. A device for measuring a direction of magnetization, comprising:

a type A magneto-resistive element having a reference layer that is magnetically pinned in a direction that is at a positive angle relative to an X direction;

a type B magneto-resistive element having a reference layer that is magnetically pinned in a direction that is parallel to said X direction;

a type C magneto-resistive element having a reference layer that is magnetically pinned in a direction that is at a negative angle relative to said X direction;

said positive angle and said negative angle having identical values of about 45 degrees;

said three types of magneto-resistive element arranged as four parallel strings of said magneto-resistive elements;

the first resistive element string further comprising two serially connected type C elements, there being a ground connection at a first end and a voltage output terminal at a second end;

the second resistive element string further comprising two serially connected type A elements, there being a ground connection at a first end and a voltage output terminal at a second;

the third resistive element branch further comprising a type A element in series with a type C element, there being a ground connection at a first end and a voltage output terminal at a second end;

the fourth resistive element branch further comprising two serially connected type B elements, there being a ground connection at a first end and a voltage output terminal at a second end;

a first constant current source for driving said first resistive element string;

a second constant current source for driving said second resistive element string;

a third constant current source for driving said third resistive element string;

a fourth constant current source for driving said fourth resistive element string;

currents from said the first and second constant current sources having identical values;

currents from said the third and fourth constant current sources having identical values;

said voltage output terminals from said first and second resistive element strings being connected to a first amplifier and said voltage output terminals from said third and fourth resistive element strings being connected to a second amplifier whereby said first amplifier outputs a voltage whose magnitude is proportional to the sine of said angle that is being measured and said second amplifier outputs a voltage whose magnitude is proportional to the cosine of said angle;

said first and second amplifier outputs being connected to a microcontroller wherein a value for said angle is computable from the equation $\arctan \theta = \sin \theta / \cos \theta$; and a quadrant in which said angle belongs being computable through comparison of the signs of said first and second amplifier outputs.

32. The device described in claim 31 wherein each said type A, type B, and type C resistive elements is selected from the group consisting of GMR and MTJ devices.

33. The device described of claim 31 wherein said type A, type B and type C magneto-resistive elements are all fabricated together on a single wafer whereby they have identical geometry, resistance and magneto-resistance.

34. The device described in claim 31 wherein said common voltage source provides a voltage between about 0.5 and 5.0 volts.

35. The device described in claim 31 wherein each of said magneto-resistive elements has an AFM layer selected from the group consisting of PtMn, NiMn, PtPdMn, CrPtMn.

36. The device described in claim 31 wherein each magneto-resistive element has an AP1 layer that is between about 10 and 30 Angstroms thick.

37. The device described in claim 31 wherein each magneto-resistive element has an AP2 layer that is between about 20 and 50 Angstroms thick.

* * * * *

UNITED STATES PATENT AND TRADEMARK OFFICE
CERTIFICATE OF CORRECTION

PATENT NO. : 7,394,247 B1 Page 1 of 1
APPLICATION NO. : 11/881349
DATED : July 1, 2008
INVENTOR(S) : Yimin Guo, Po-Kang Wang and Grace Gorman It is certified that error appears in the above-identified patent and that said Letters Patent is hereby corrected as shown below:

In the Assignees, (73), delete Assignee, "Magic Technologies, Inc., Milpitas, CA (US)" and replace with -- MagIC Technologies, Inc., Milpitas, CA (US) --.

Signed and Sealed this

Eleventh Day of November, 2008

JON W. DUDAS
*Director of the United States Patent and Trademark Office*